United States Patent
Twitchen (10) Patent No.: US 9,214,407 B2
(45) Date of Patent: Dec. 15, 2015

(54) SYNTHETIC DIAMOND HEAT SPREADERS

(71) Applicant: Element Six Technologies Limited, Oxfordshire (GB)

(72) Inventor: Daniel Twitchen, Santa Clara, CA (US)

(73) Assignee: ELEMENT SIX TECHNOLOGIES LIMITED, London (GB)

(*) Notice: Subject to any disclaimer, the term of this patent is extended or adjusted under 35 U.S.C. 154(b) by 0 days.

(21) Appl. No.: 14/439,750

(22) PCT Filed: Nov. 19, 2013

(86) PCT No.: PCT/EP2013/074158
§ 371 (c)(1),
(2) Date: Apr. 30, 2015

(87) PCT Pub. No.: WO2014/079836
PCT Pub. Date: May 30, 2014

(65) Prior Publication Data
US 2015/0294922 A1    Oct. 15, 2015

Related U.S. Application Data

(60) Provisional application No. 61/728,929, filed on Nov. 21, 2012.

(30) Foreign Application Priority Data

Jan. 29, 2013  (GB) .................................. 1301560.7

(51) Int. Cl.
*H01L 23/00*   (2006.01)
*H01L 23/373*  (2006.01)
(Continued)

(52) U.S. Cl.
CPC ............ *H01L 23/3732* (2013.01); *H01L 23/36* (2013.01); *H01L 23/3677* (2013.01); *H01L 29/2003* (2013.01)

(58) Field of Classification Search
CPC .. H01L 23/3732; H01L 23/3677; H01L 23/36
See application file for complete search history.

(56) References Cited

U.S. PATENT DOCUMENTS 5,648,148 A   7/1997 Simpson
5,704,976 A   1/1998 Snail
(Continued)

FOREIGN PATENT DOCUMENTS

EP   1415022 A1   2/2003
EP   2196564 A1   6/2010
(Continued)

OTHER PUBLICATIONS

International Search Report for PCT/EP2013/074158 dated Jun. 2, 2014.
(Continued)

*Primary Examiner* — Ngan Ngo
(74) *Attorney, Agent, or Firm* — Bryan Cave LLP (57) ABSTRACT

A synthetic diamond heat spreader, the synthetic diamond heat spreader comprising: a synthetic diamond material including a surface layer having a $^{13}C$ content of less than a natural isotopic abundance (1.1%) and a support layer which is thicker than the surface layer and which has an isotopic abundance of $^{13}C$ which is closer to the natural isotopic abundance than the surface layer, wherein at least 50% of a thickness of the synthetic diamond material is formed of the support layer; and a non-diamond thermal transfer layer disposed in contact with the surface layer of the synthetic diamond material for transferring heat into the surface layer.

16 Claims, 2 Drawing Sheets

(51) Int. Cl.
*H01L 29/20* (2006.01)
*H01L 23/367* (2006.01)
*H01L 23/36* (2006.01)

(56) References Cited

U.S. PATENT DOCUMENTS

| | | | |
|---|---|---|---|
| 6,582,513 | B1 | 6/2003 | Linares et al. |
| 2003/0131787 | A1 | 7/2003 | Linares et al. |
| 2006/0113546 | A1 | 6/2006 | Sung |
| 2013/0161648 | A1* | 6/2013 | Khan .............................. 257/77 |
| 2013/0175546 | A1* | 7/2013 | Khan .............................. 257/77 |
| 2014/0110722 | A1* | 4/2014 | Kub et al. ....................... 257/77 |

FOREIGN PATENT DOCUMENTS

| | | |
|---|---|---|
| WO | 920800 A1 | 1/1992 |
| WO | 9323204 A1 | 11/1993 |
| WO | 03014427 A1 | 2/2003 |
| WO | 2006081348 A1 | 8/2006 |
| WO | 2006100559 A1 | 9/2006 |
| WO | 2010010352 A1 | 1/2010 |

OTHER PUBLICATIONS

Search Report for GB1301560.7 dated May 20, 2013.
Search Report for GB1320383.1 dated Jun. 20, 2014.
J.E. Graebner, "Thermal Conductivity of CVD Diamond: Techniques and Results," Diamond Films & Technol., (Japan) vol. 3, No. 2, 1993, 77-130.
L. Wei et al., "Thermal Conductivity of Isotopically Modified Single Crystal Diamond," Phys. Rev. Lett. 70(24) (1993) 3764-7.
J. Callaway, "Model for Lattice Thermal Conductivity at Low Temperatures," Physic. Rev, vol. 113, 1959.

* cited by examiner

Using an approximate solution to phonon Boltzmann transport equation $\dagger$, $$k = \frac{1}{3}\sum_{q,J} \underbrace{C_J(q)}_{\text{Heat Capacity}} \underbrace{V_J^2(q)}_{\text{Group Velocity}} \underbrace{\tau_{C,J}(q)}_{\text{Scattering Time}} \approx \left(\frac{k_B}{\hbar}\right)^3 \frac{k_B}{2\pi^2 v} T^3 \int_0^{\theta_D/T} \frac{\tau_C x^4 e^x}{(e^x-1)^2} dx$$

Figure 3

SYNTHETIC DIAMOND HEAT SPREADERS

FIELD OF INVENTION

The present invention relates to thermal management applications which utilize synthetic diamond heat spreaders.

BACKGROUND OF INVENTION

The promised performance of wide band gap electronic devices (e.g. GaN based) will result in much high power dissipation and localized heat generation at contacts and in channel regions than can be accommodated by current state-of-the-art thermal management configurations. As a consequence, use of conventional cooling techniques imposes a ceiling on wide band gap device performance and reliability. Overcoming such barriers requires thermal engineering at the macro, micro, and nano-scale, which can provide significant reductions in the near-junction temperature rise and component thermal resistance.

Specific challenges relate to heat spreading in certain types of radio frequency (rf) power devices. In such devices the local power densities can exceed 1 MW/cm$^2$. Spreading this heat and lowering the junction temperature enables increased reliability and also continuous wave performance. In addition to electronic device applications, there is also a need to improve upon current state-of-the-art thermal management configurations in certain extreme optical applications.

Synthetic diamond materials have been proposed as an ideal solution in extreme thermal management applications due to the high in-plane thermal conductivity of such materials. For example, various grades of synthetic diamond material grown by chemical vapour deposition (CVD) are already commercially available for thermal heat spreading applications including both polycrystalline and single crystal synthetic diamond materials.

The thermal performance of a particular synthetic diamond material will depend on its macro, micro, and nano-scale structure. Factors that contribute to thermal performance are those that lead to scattering of phonons within the synthetic diamond material [J. E. Graebner, Diamond Films Technol., (Japan) 3 (1993) p 77 includes a survey of phonon scattering in diamond thin films]. For example in synthetic diamond materials factors which lead to scattering of phonons include: intrinsic mechanisms (phonon-phonon related); point defects (e.g. defects such as nitrogen and vacancy clusters); and extended defects (e.g. stacking faults and dislocations). As such, synthetic diamond materials which are optimized for improved thermal performance are those which have reduced defects in terms of both point defects and extended defects. Furthermore, synthetic diamond materials which are optimized for improved thermal performance may also be tailored to reduce intrinsic phonon scattering mechanisms.

Dominant amongst intrinsic phonon scattering mechanisms are those related to the relative masses of $^{12}$C and $^{13}$C. The natural abundance of $^{13}$C is 1.1% meaning that approximately 1 in every 100 atoms has a 12/13 difference in mass and hence different phonon energy. Isotopically controlled single crystal diamond theory [R. Berman, Thermal Conductivity in Solids (Clarendon Press 1976)] and experiment [e.g. General Electric, L. Wei, P. K. Kuo, R. L. Thomas, T. R Anthony, W. F. Banholzer, Phys Rev Lett 70 (1993) p 3764] has shown that bulk thermal conductivity can increase by nearly a factor of two up to 4000 W/mK. As such, it is known in the art that reducing the $^{13}$C content in synthetic diamond materials can reduce intrinsic phonon scattering and increase bulk thermal conductivity, particularly in relation to single crystal synthetic diamond materials. However, one problem with this approach is that such isotopically purified synthetic diamond materials require a fabrication process which utilizes an isotopically purified carbon source. Such isotopically purified carbon sources are expensive and thus while isotopically purified synthetic diamond materials can have improved thermal performance this improvement can be offset by increased expense resulting in the materials having a reduced commercial viability in certain applications.

U.S. Pat. No. 6,582,513 (Apollo) also recognizes that the thermal conductivity of synthetic diamond materials can be increased by reducing the $^{13}$C content in such materials. This document also suggests that providing alternating layers of single crystal diamond material having different levels of dopant distributed throughout the single crystal lattice can be used to manage strain through the single crystal lattice due to lattice mismatches between differently doped diamond layers. Various examples are given including using alternating layers of undoped $^{12}$C and $^{13}$C diamond material. It is indicated that such a structure can end in either a $^{12}$C or a $^{13}$C layer and then be used to grow single crystal plates of either $^{12}$C or $^{13}$C diamond. However, this approach still requires a relatively larger quantity of isotopically purified carbon source material increasing cost and resulting in the materials having a reduced commercial viability in certain applications.

It may also be noted that isotopically purified synthetic diamond materials have also been proposed for use in non-thermal applications such as quantum sensing and quantum information processing. For example, WO2010010352 describes that fabricating isotopically purified synthetic diamond materials can improve the optical stability of certain fluorescent point defects disposed within synthetic diamond materials leading to performance improvements in quantum optics applications. Such quantum grade synthetic diamond materials are of the highest chemical purity and crystallographic quality and are much too expensive for use in more basic thermal heat spreading applications.

It is an aim of certain embodiments of the present invention to provide synthetic diamond materials which have improved thermal performance without significantly increasing fabrication costs leading to more commercial viable products for extreme thermal management applications.

SUMMARY OF INVENTION

According to one aspect of the present invention there is provided a synthetic diamond heat spreader, the synthetic diamond heat spreader comprising:
  a synthetic diamond material including a surface layer having a $^{13}$C content of less than a natural isotopic abundance (1.1%) and a support layer which is thicker than the surface layer and which has an isotopic abundance of $^{13}$C which is closer to the natural isotopic abundance than the surface layer, wherein at least 50% 60%, 70%, 80%, or 90% of a thickness of the synthetic diamond material is formed of the support layer; and
  a non-diamond thermal transfer layer disposed in contact with the surface layer of the synthetic diamond material for transferring heat into the surface layer.

The present inventor has recognized that reducing the isotopic abundance of $^{13}$C in a synthetic diamond material can improve the thermal conductivity of the synthetic diamond material as taught in the prior art. Furthermore, the present inventor has recognized that this increases the expense of the synthetic diamond fabrication process because isotopically purified carbon sources required for such fabrication processes are more expensive than those with a natural isotopic abundance of carbon. Further still, the present inventor has recognized that in heat spreading applications the thermal barrier resistance at the interface between the heat spreader and a heat generating component often dominates the efficiency of the thermal heat spreader, particularly when using synthetic diamond material as the heat spreader.

In light of the above, the present inventor proposes to provide a synthetic diamond heat spreader in which the surface thermal interface layer of the diamond material which is placed in contact with a non-diamond thermal transfer layer is isotopically purified by reducing the amount of $^{13}C$ to have an increased thermal conductivity with the bulk of the diamond material being formed of a diamond material which has a natural isotopic abundance of carbon (or at least is not so isotopically purified as the surface thermal interface layer). Such a heat spreader will have improved thermal heat spreading characteristics when compared to a heat spreader which is formed of synthetic diamond material having a natural isotopic abundance of carbon. Furthermore, such a heat spreader will have a thermal heat spreading performance close to that of a diamond heat spreader which is isotopically purified throughout its thickness, or throughout a plurality of alternating layers, at a fraction of the cost. While it has also been recognized that a corresponding technical effect can be achieved by providing a thin surface interface layer which is isotopically purified to essentially consist of only $^{13}C$ rather than $^{12}C$, this alternative option is more expensive to achieve in practice and is thus cost prohibitive.

According to a further aspect of the present invention there is provided a device comprising a heat generating component and a synthetic diamond heat spreader as defined above, wherein the synthetic diamond material is located adjacent the heat generating component with the surface layer proximal to at least a portion of the heat generating component. The heat generating component may comprise an electronic semi-conducting component such as in an electronic device. Alternatively, the heat generating component may comprise an optical component such as in an optical device. The heat generating component may form the non-diamond thermal transfer layer disposed in contact with the surface layer of the synthetic diamond material for transferring heat into the surface layer. Alternatively, an additional non-diamond thermal transfer layer, such as a metallization layer or other bonding layer, may be located between the heat generating component and the synthetic diamond material.

According to yet another aspect of the present invention there is provided a method of fabricating a synthetic diamond material for use in a heat spreader as defined above, the method comprising:
  growing a synthetic diamond material in a chemical vapour deposition reactor using a carbon source gas; and
  controlling the isotopic composition of the carbon source gas during growth to form a two layer diamond structure including a surface layer having a $^{13}C$ content of less than a natural isotopic abundance (1.1%) and a support layer which is thicker than the surface layer and which has an isotopic abundance of $^{13}C$ which is closer to the natural isotopic abundance than the surface layer, wherein at least 50% of a thickness of the synthetic diamond material is formed of the support layer,
  wherein, at least during growth of the surface layer, at least 50% of the carbon source gas is recirculated after passing through the chemical vapour deposition reactor and reintroduced into the chemical vapour deposition reactor.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Key figures of merit for thermal performance of synthetic diamond materials are the thermal barrier resistance (TBR) and average bulk thermal conductivity (TC). For high thermal performance it is desirable for the thermal barrier resistance to be minimized while the average bulk thermal conductivity is maximised, i.e. TC/TBR to be as large as possible. In any geometry where synthetic diamond is used in thermal management these properties come into play. For example, in a metallized bonded approach, the thickness of the metal, its thermal conductivity, and interfacial thermal barriers all contribute to an overall thermal barrier resistance, while thermal conductivity then determines the heat spreading capacity of the diamond heat spreader once the heat has travelled through the interface.

To minimize thermal barrier resistance it is desirable to match acoustic velocities between materials, obviously with the best match for synthetic diamond material being diamond on diamond. However, for a number of practical and integration reasons compromises have to be made with the bonding material, hence it is then desirable that all other factors that contribute to thermal barrier resistance are as low as possible.

Factors that contribute to thermal barrier resistance and bulk thermal conductivity in diamond materials are those that lead to scattering of phonons. As previously indicated in the background section, in synthetic diamond material diamond these factors include: intrinsic mechanisms (e.g. due to a natural abundance of $^{13}C$); point defects (e.g. defects such as nitrogen and vacancy related defects); and extended defects (e.g. stacking faults and dislocations). As such, it has been recognized in the prior art that reducing defects and/or fabricating isotopically purified synthetic diamond material can improve thermal performance.

Room temperature thermal conductivity values up to 25 W/cm K have been reported for the highest quality single crystals of type IIa diamond material. In contrast to a metal, where thermal conductivity is provided by the mobility of conduction band electrons, heat transfer in electrically insulating diamond material is solely carried by lattice vibrations, i.e. phonons. The reason for the outstanding thermal conductivity of diamond material, and its high Debye-temperature of 2000 K, is the stiffness of the spa bonds forming its rigid structure together with the low mass of carbon atoms. In most applications, the temperature is well below the Debye temperature and, hence, phonon-phonon scattering is small, resulting in little impedance for the phonon-mediated heat transport in a large high purity diamond crystal.

Extrinsic phonon scattering mechanisms are the main source of thermal resistance in less pure diamond material. For single crystal diamond material, scattering at the sample's boundaries, at impurities, and at vacancies are the main contributions. For polycrystalline diamond materials, additional contributions arise from scattering at grain boundaries, dislocations, and extended defects. All contributions influencing thermal conductivity depend on the wavelength of the contributing phonons and, therefore, on the temperature of the sample. Hence, for understanding phonon scattering mechanisms and their relative contributions, measurements of the temperature dependent thermal conductivity are of basic importance.

Thermal conductivity and thermal resistance are macroscopic quantities that are related to microscopic properties by the gas kinetic definition of thermal conductivity based on phonons as quantised lattice vibrations. In this physical picture, thermal conductivity K can be described by $$K = (1/3)Cv^2\tau^{-1}$$

where C is the phonon contribution to the heat capacity per unit volume, v is the velocity of the phonons, and τ is the phonon scattering rate. As phonons of different wavelengths, ranging over a temperature dependent spectrum, contribute to the thermal transport, a more complete description of K according to the Klemens-Callaway model can be given by integration over the temperature-dependent Debye phonon wavelength spectrum.

In isotopically pure, defect-free diamond crystals of sufficient thickness, phonon-phonon scattering is the only mechanism generating thermal resistance and at elevated temperatures, i.e. well above the Debye temperature, this is the dominant contribution also in less pure material. Due to the low mass of carbon atoms, changes in the isotopic content of diamond significantly affect its thermal conductivity, as the phonons are scattered due to the difference in mass of the different isotopes of carbon. Similar scattering also occurs at vacancies and impurity sites where the scattering rate depends on the wavelength of the phonons. For extended defects like clusters or aggregates of foreign or disordered atoms with a size much smaller than the wavelength of the lattice vibrations, scattering is similar to that at point defects. For phonon wavelengths similar in size to extended defects, the scattering rate becomes independent of the phonon wavelength. Dislocations are another source of thermal resistance, since the phonons are scattered in the strain field in the vicinity of dislocations. Scattering at boundaries is most important at lowest temperatures where the phonon wavelength is comparable to or larger than the geometrical dimensions of the crystal. The type of reflection, i.e. specular or diffuse, critically depends on the microstructure of the boundaries and determines the impact on thermal resistance.

In high quality material, the thermal conductivity is determined by the purity of the crystal. The most important impurities for lowering thermal conductivity are nitrogen, hydrogen, and the $^{13}C$ isotope of carbon. The purest type IIa material has the highest thermal conductivity while in type Ia and Ib material having nitrogen impurities, thermal conductivity is significantly lower. Several groups have measured the thermal conductivity of natural single crystal diamond as a function of temperature.

The content of the heavier carbon isotope $^{13}C$ has a tremendous impact on the phonon scattering rate and the highest thermal conductivity is expected for isotopically pure $^{12}C$ (or $^{13}C$) diamond. The influence of the $^{13}C/^{12}C$ concentration ratio on thermal conductivity has systematically been explored experimentally and theoretically in L. Wei, P. K. Kuo, R. L. Thomas, T. R Anthony, W. F. Banholzer, Phys Rev Lett 70 (1993). It was found that thermal conductivity varies by factor of three when varying the $^{13}C$ content from 0.001% to 50%, while it varies by nearly two orders of magnitude at 80 K.

While the aforementioned work relates to bulk thermal conductivity of diamond materials, recent modelling and experimental work has shown that unless a thermal barrier resistance of below a certain level (approximately 25 m$^2$K/GW) is achievable any benefits in electronic devices associated with the high bulk thermal conductivity of synthetic diamond materials are limited over current incumbent solutions such as gallium nitride grown on silicon carbide thermal heat spreading substrates. In this regard, temperature rise versus device size has recently been modelled and measured for diamond substrate based devices and silicon carbide based devices using an exemplifying device structure in the form of a HEMT (high electron mobility transistor) device disposed over a silicon carbide or diamond substrate with a gallium nitride buffer layer disposed therebetween. Given the relatively large thermal conductivity of the diamond substrate material when compared to the silicon carbide substrate material, one might expect that the heat spreading capability of the diamond substrate material would outperform that of the silicon carbide substrate material and indeed this is the case for large area devices. That is, at larger device widths the temperature rise of the device is lower when using a diamond substrate compared to a silicon carbide substrate and this is the case where the thermal barrier resistance is low or relatively high. However, as one shrinks the width of the HEMT device the temperature rise of the structure becomes more dependent on the thermal barrier resistance and this dependence is greater for the diamond substrate material than for the silicon carbide material. As such, if the thermal barrier resistance of the diamond substrate is relatively high then the temperature rise of the device structure is higher than for a silicon carbide substrate when the HEMT device is small in size. This illustrates the importance of the thermal barrier resistance when utilizing synthetic diamond material in heat spreading applications and that merely providing a high bulk thermal conductivity does not necessarily result in an efficient thermal heat spreading configuration.

In light of the above, the present inventor has recognized that improving the bulk thermal conductivity of diamond material via isotopic carbon control will add significant expense while not necessarily providing a significant improvement to the thermal performance of the heat spreader. Furthermore, the present inventor has recognized that only a thin thermal interface layer of a synthetic diamond heat spreader will contribute to the thermal barrier resistance. As such, embodiments of the present invention provide a synthetic diamond heat spreader in which only a thin surface interface layer has a very low $^{13}C$ content to improve the thermal properties of the synthetic diamond material at the thermal interface with a non-diamond thermal transfer layer. Optionally the $^{13}C$ content of the surface layer is less than 1.0%, 0.8%, 0.6%, 0.4%, 0.2%, 0.1%, 0.05%, or 0.01%. Reducing the $^{13}C$ content of the surface layer increases the thermal performance of the material but with an associated increase in cost. As such, the precise $^{13}C$ content will be dependent on a cost versus performance analysis for a particular application.

The surface layer may have a thickness of no more than 50 µm, 40 µm, 30 µm, 20 µm, 15 µm, 10 µm, 8 µm, 6 µm, 4 µm, 2 µm, or 1 µm. Increasing the thickness of the isotopically purified surface layer may increase thermal performance of the material but with an associated increase in cost. As such, the precise thickness of the surface layer, in addition to the precise $^{13}$C content of the surface layer, will be dependent on a cost versus performance analysis for a particular application.

The support layer may have a thickness of no less than 10 µm, 30 µm, 50 µm, 70 µm, 90 µm, 110 µm, 130 µm, 150 µm, 180 µm, 200 µm, 250 µm, 350 µm, 500 µm, or 1000 µm. The thickness of the support layer will be dependent on both thermal performance requirements and mechanical strength requirements for a particular end application. Thermal applications usually require a minimum total thickness of diamond material in order to achieve the maximum thermal benefit from utilizing diamond material. For example, in certain radio frequency power devices it has been found that a diamond heat spreader thickness of about 150 µm is required to achieve the maximum thermal benefit from utilizing diamond material but that the thermal barrier resistance is dominated by only the first few microns. In such applications, it may thus be desirable to provide a diamond heat spreader having a total thickness of at least about 150 µm with an isotopically purified surface layer a few microns in thickness. In contrast, certain optical applications require much thicker layers of diamond material. In addition, for certain applications the synthetic diamond material will be required to have sufficient mechanical strength that it can form a free-standing wafer. At the same time, it should be recognized that the synthetic diamond material should not be made unduly thick unless required for a particular application as this will increase costs. It is envisaged that the largest benefits will be achieved by applying the present invention to configurations which require a relative thick diamond wafer which would be very costly to grow entirely from isotopically purified synthetic diamond material.

The support layer underlying the surface interface layer may have a natural isotopic abundance of $^{13}$C to reduce the cost of this layer. However, it is also envisaged that the support layer could be isotopically purified to a lower extent than the surface interface layer thereby reducing the fabrication cost of the support layer relative to the surface interface layer. It is also envisaged that a graded interface may be provided between the surface layer and the support layer such that the $^{13}$C content is gradually increased on moving from the surface layer to the support layer.

According to certain embodiments the synthetic diamond material includes only two layers: (1) the isotopically purified surface layer providing the thermal interface layer; and (2) the support layer which has a substantially natural isotopic abundance of carbon. However, in certain embodiments further layers may be provided. That said, in order to achieve the combination of high thermal performance and low fabrication cost, the cheaper support layer should form the majority of the synthetic diamond material. Accordingly, at least 50%, 60%, 70%, 80%, or 90% of the thickness of the synthetic diamond material should be formed of the support layer.

The solution proposed here is based on the applicant's ability to grow high quality $^{12}$C synthetic diamond material while at the same time taking into account considerations of carbon source costs and other defect densities. The proposed solution here recognizes that intrinsic phonon scattering processes limit both the thermal barrier resistance and average bulk thermal conductivity of all synthetic diamond materials at room temperature. Hence, even if perfect diamond is possible (no point or extended defects), the thermal barrier resistance and average bulk thermal conductivity is still strongly influenced by phonon scattering processes which have a relatively steep dependence on temperature, especially at usual junction temperatures.

Figure 1:
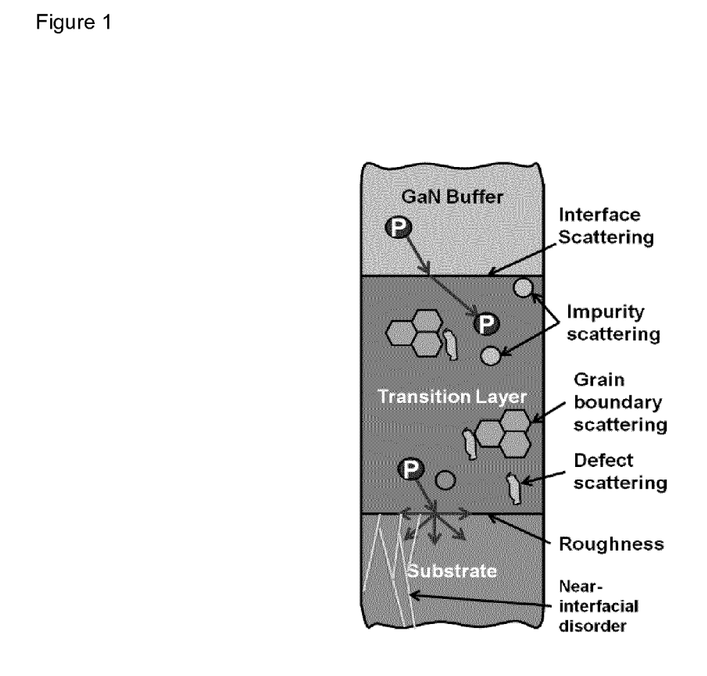
FIG. 1 illustrates phonon scattering mechanisms at an interface region between a thermal substrate and an overlying device layer.

FIG. 1 illustrates phonon scattering mechanisms at an interface region between a thermal substrate and an overlying device layer. The illustrated device structure comprises a gallium nitride buffer layer disposed over a diamond substrate layer with a transition layer disposed therebetween. A phonon located within the gallium nitride layer propagates into the transition layer and is subject to interface scattering, impurity scattering, grain boundary scattering, and crystal defect scattering. A phonon located within the transition region then propagates into the substrate layer and is also subject to scattering mechanisms including via surface roughness and near-interfacial disorder within the diamond substrate.

Figure 2:
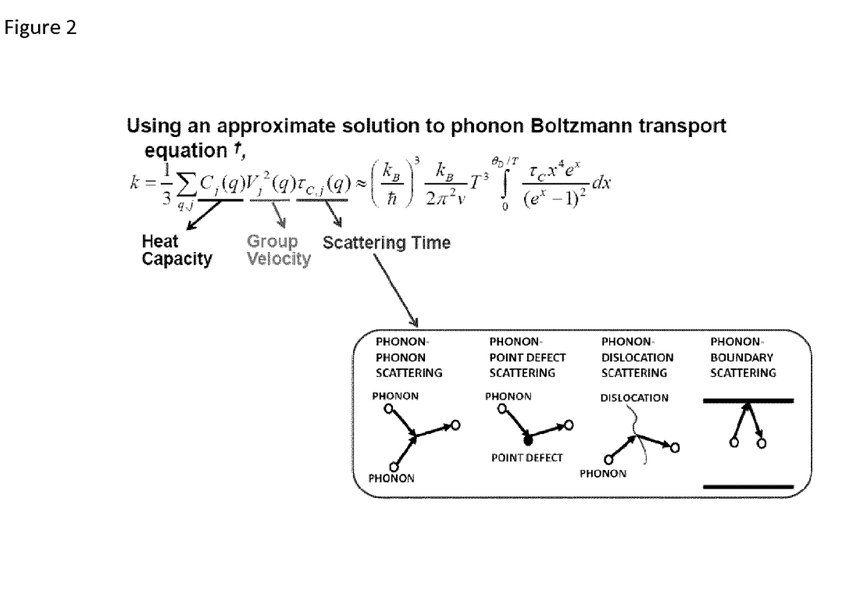
FIG. 2 illustrates the underlying theory for phonon transport at an interface region between a thermal substrate and an overlying device layer.

FIG. 2 illustrates the underlying theory for phonon transport at an interface region between a thermal substrate and an overlying device layer. An approximate solution to the phonon Boltzmann transport equation includes terms which are a function of heat capacity, group velocity, and scattering time. The scattering term will include contributions from a range of scattering mechanisms including phonon-phonon scattering, phonon-point defect scattering, phonon-dislocation scattering, and phonon-boundary scattering as illustrated. This analysis is taken from J. Callawy, Physic. Rev, vol. 113, 1959. In the prior art the analysis has been performed for a gallium nitride layer disposed over a silicon carbide substrate with an aluminium nitride interface layer disposed therebetween. However, the analysis is equally applicable to diamond heat spreading substrates and indeed, as previously described, scattering effects at the thermal interface can be more important for diamond materials.

It is desirable that any solution found which maximises thermal conductivity while minimizing thermal barrier resistance is also applicable at usual junction operating temperatures and consequently as high as 550K. In part, it may be postulated that the lack of understanding of these factors and their relative contributions as a function of temperature in combination with synthesis cost considerations is one of the reasons this invention has not been previously proposed.

In certain embodiments the synthetic diamond material may be CVD synthetic diamond material, for example single crystal CVD synthetic diamond material. As previously indicated, isotopically controlled single crystal diamond theory (Berman) and experiment (General Electric, 1992) has shown that bulk thermal conductivity can increase by nearly a factor of 1.5 to close to 3500 W/mK at 300K.

Possibly slightly less well known is that the highest quality polycrystalline CVD synthetic diamond materials can also have thermal conductivities where phonon processes due to point defects and $^{13}$C content are one of the dominant, if not the dominant, scattering mechanism reducing thermal conductivity and thermal barrier resistance. In this regard, it may be noted that the thermal conductivity of lower quality polycrystalline CVD synthetic diamond material is thought to be dominated by extended defects while the thermal conductivity of high quality polycrystalline CVD synthetic diamond materials can be dominated by point defects and $^{13}$C content. As such, while improvements in thermal conductivity and thermal barrier resistance can be achieved in a range of polycrystalline CVD synthetic diamond materials by application of the present invention, it is envisaged that the invention will be particularly applicable to high quality polycrystalline CVD synthetic diamond materials which have a thermal performance dominated by point defect and $^{13}$C content phonon mechanisms.

Figure 3:
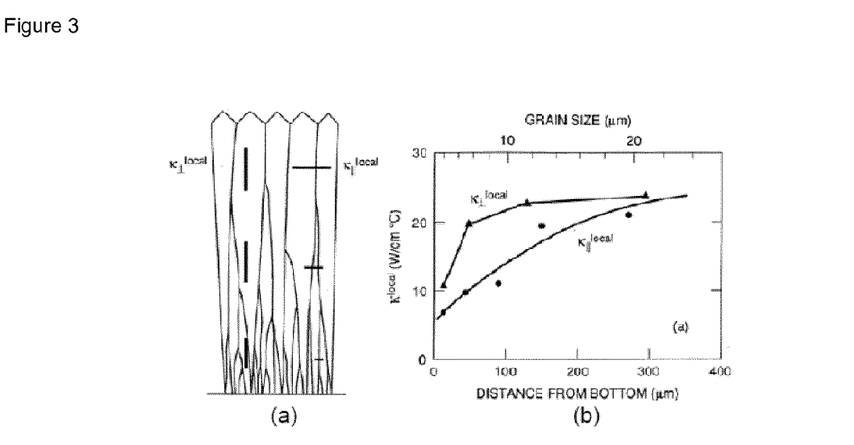
FIG. 3 illustrates how thermal conductivity of polycrystalline CVD synthetic diamond material increases on passing from a nucleation face of the polycrystalline CVD synthetic diamond material to a growth face of the polycrystalline CVD synthetic diamond material.

Similar considerations also apply when deciding which surface of a polycrystalline CVD synthetic diamond material should be made isotopically purified. It is known that the nucleation face of a polycrystalline CVD synthetic diamond wafer has smaller grain size and lower thermal conductivity than the growth face of a polycrystalline CVD synthetic diamond wafer. FIG. 3 illustrates how thermal conductivity of polycrystalline CVD synthetic diamond material increases on passing from a nucleation face of the polycrystalline CVD synthetic diamond material to a growth face of the polycrystalline CVD synthetic diamond material. As such, given the choice of which face of a polycrystalline CVD synthetic diamond wafer should be located close to a heat generating component, one would choose the growth face having the larger grain size and lower crystal defect content. In this case, it would be advantageous to make the growth face isotopically purified in accordance with the present invention.

Conversely, in some fabrication process the nucleation face will inevitably be located closer to the heat generating source. For example, in a device manufacturing process where the diamond material is grown directly on a heat generating component the nucleation face of the diamond material will inevitably form closest to the heat generating component. While this will result in the thermal interface being formed of lower thermal conductivity diamond material, this disadvantage can be off-set to some extent by making the nucleation face isotopically purified in accordance with the present invention.

Similar comments also apply to another device manufacturing process comprising: growth of diamond material on a substrate such as silicon or silicon carbide; processing of the substrate to form a thin layer; and then growth of a semiconductive component on the thin layer. Such a fabrication process also results in the nucleation face of the diamond material being located closest to the heat generating semiconductor component. However, the lower thermal conductivity of the nucleation face material may be off-set to some extent by making it isotopically purified in accordance with the present invention.

The isotopically purified surface layer may have an average thermal conductivity, as measured at 300 K, of no less than 400 W/mK, 600 W/mK, 800 W/mK, 1000 W/mK, 1200 W/mK, 1400 W/mK, 1600 W/mK, 1800 W/mK, 2000 W/mK, 2200 W/mK, 2400 W/mK, 2600 W/mK, 2800 W/mK, or 3000 W/mK. In practice the thermal conductivity of the surface layer will usually not exceed 4400 W/mK. Furthermore, the support layer may have an average thermal conductivity, as measured at 300 K, of no less than 400 W/mK, 600 W/mK, 800 W/mK, 1000 W/mK, 1200 W/mK, 1400 W/mK, 1500 W/mK, 1800 W/mK, or 1900 W/mK. Usually it will be desirable to provide a support layer which has a reasonably good thermal conductivity but which is reasonably economic to grow. As such, in practice the average thermal conductivity of the surface layer will usually not exceed 2200 W/mK.

In certain embodiments both the support layer and the surface layer of the synthetic diamond material is formed of the same type of diamond material. For example, both the support layer and the surface layer may be formed of polycrystalline CVD diamond material or may both be formed of single crystal CVD diamond material. In these examples, a continuous growth process may be provided to form the support layer and the surface layer where the two different layers are defined by simply switching between an isotopically purified carbon source and one which is not isotopically purified during the growth process. Alternatively, the support layer and the surface layer of the synthetic diamond material may be formed of the different types of diamond material. For example, a thin layer of isotopically purified CVD diamond material could be grown on a HPHT synthetic diamond substrate which forms the support substrate of the final heat spreader. Alternatively, a thin layer of isotopically purified CVD diamond material could be grown on a silicon cemented diamond composite substrate which forms the support substrate of the final heat spreader.

In many heat spreading applications it is required that the heat spreader is electrically insulating. As such, for these applications the isotopically purified thin surface layer of diamond material and, optionally, the diamond support layer, are formed of electrically insulating diamond material, i.e. diamond material which is not doped with, for example, boron to be electrically conductive.

Where a CVD synthesis process is utilized to grown the isotopically purified thermal interface layer, gas recirculation may be utilized to limit the quantity of isotopically purified carbon source gas which is required to grow the thermal interface layer to further reduce synthesis costs. Accordingly, the method of fabricating the synthetic diamond material as described herein may comprise:

growing a synthetic diamond material in a chemical vapour deposition reactor using a carbon source gas, and
controlling the isotopic composition of the carbon source gas during growth to form a two layer diamond structure including a surface layer having a $^{13}C$ content of less than a natural isotopic abundance (1.1%) and a support layer which is thicker than the surface layer and which has an isotopic abundance of $^{13}C$ which is closer to the natural isotopic abundance than the surface layer, wherein at least 50% of a thickness of the synthetic diamond material is formed of the support layer,
wherein, at least during growth of the surface layer, at least 50% of the carbon source gas is recirculated after passing through the chemical vapour deposition reactor and reintroduced into the chemical vapour deposition reactor.

Furthermore, other impurities may be controlled in combination with isotopic carbon control during CVD diamond growth to further improve the thermal performance of the product material, particularly keeping nitrogen content low and/or using high power densities during growth to reduce the quantity of gas impurities which are incorporated into the synthetic diamond product material during growth.

The present invention can usefully be applied to grades of diamond material which already have a high thermal conductivity to further improve the thermal performance of the materials without substantially increasing fabrication costs, e.g. high performance thermal grades of single crystal or polycrystalline CVD diamond materials available from Element Six Ltd. As such, in certain embodiments it is preferred that the support has an average thermal conductivity of no less than 1500 W/mK, 1800 W/mK, 1900 W/mK, or 2000 W/mK and the surface layer has an average thermal conductivity of no less than 2000 W/mK, 2200 W/mK, 2400 W/mK, 2600 W/mK, 12800 W/mK, or 3000 W/mK as measured at 300 K. Furthermore, it is recognized that for applications which require a relatively thick and/or relatively large diameter wafer of synthetic diamond material, the present invention is particularly useful as only a small fraction of the wafer is required to be fabricated using expensive isotopically purified carbon source material. As such, in certain embodiments it is preferred that the synthetic diamond material has a largest linear dimension of at least 50 mm, 60 mm, 70 mm, 80 mm, 90 mm, 100 mm, 110 mm, 120 mm, 130 mm, or 140 mm and/or a thickness of at least 0.2 mm, 0.3 mm, 0.5 mm, 0.75 mm, 1.0 mm, 1.3 mm, 1.5 mm, or 2.0 mm.

A non-diamond thermal transfer layer is placed in contact with the isotopically purified surface layer of synthetic diamond material to transfer heat into the synthetic diamond material via the isotopically purified layer. The non-diamond thermal transfer layer may be bonded to the surface layer of the synthetic diamond material or may be merely placed in contact with the surface layer of the synthetic diamond material, e.g. with a thermally conductive fluid to provide good thermal contact.

Various options are possible for the non-diamond thermal transfer layer. For example, the non-diamond thermal transfer layer may comprise a metal layer disposed on the isotopically purified surface layer of synthetic diamond material. This may be achieved my metallization of the isotopically purified surface layer, such as a titanium/platinum/gold metallization. Such metallization can be patterned and can function to provide bonding and/or electrical connections. Alternatively, the non-diamond thermal transfer layer may comprise an inorganic layer such as a layer of silicon or silicon carbide which can function as a growth layer for subsequent deposition of a compound semiconductor device layer structure thereon.

The non-diamond thermal transfer layer may comprise one or more compound semiconductor layers, e.g. one or more nitride layers including gallium nitride. Such materials are advantageous for use in high power electronic applications where efficient thermal heat spreading is required. These compound semiconductor layers may be placed in direct contact with the isotopically purified surface layer of synthetic diamond material or bonded via a metal layer or an inorganic layer as previously described.

Yet another alternative is that the isotopically purified surface layer of synthetic diamond material is placed in contact with an optical component such as a mirror, lens, prism, etalon, optical window, or laser material. In this case the optical component can form the non-diamond thermal transfer layer. Such a configuration is advantageous in high energy optical applications where optical components can be subject to heating which requires very efficient thermal heat spreading to prevent adverse effects such as increases in optical absorbance and/or thermal lensing.

The synthetic diamond materials as described herein are tailored to produce exceptional thermal performance while not incurring excessive cost increases which would otherwise render the materials commercially unviable. They achieve this advantageous combination of features by targeting improvements in thermal performance only at a thermal interface region. In use, a device may be provided comprising a heat generating component and a synthetic diamond material as described herein, wherein the synthetic diamond material is located adjacent the heat generating component with the isotopically purified surface layer proximal to at least a portion of the heat generating component. For example, the synthetic diamond material may be bonded to the heat generating component via the isotopically purified surface layer. Such bonding may be achieved via growth of the synthetic diamond material on the heat generating component, via growth of the heat generating component on the synthetic diamond material (optionally using a nucleation inter-layer such as a thin layer of silicon or silicon carbide), or by separate fabrication of the heat generating component and the synthetic diamond material which are then subsequently bonded to each other, e.g. via metallization of the synthetic diamond material, such as a titanium/platinum/gold metallization, and subsequent soldering or via Van der Waals bonding.

Whichever fabrication route is followed, to achieve advantageous thermal performance the isotopically purified surface layer of the synthetic diamond material must be located close to the heat generating component. As such, a distance between the surface layer of the synthetic diamond material and at least a portion of the heat generating component is preferably no more than 100 µm, 75 µm, 50 µm, 30 µm 10 µm, 5 µm, 3 µm, 1 µm, 100 nm, or 50 nm. The heat generating component may comprise an electronic semiconducting component such as in an electronic device. For example, the electronic semiconducting component may comprise a compound semi-conductor such as gallium nitride. Alternatively, the heat generating component may comprise an optical component such as in an optical device. If the diamond material is disposed within the light path of such an optical device then the synthetic diamond material of the present invention may also preferably be fabricated from optical grade diamond material, e.g. available from Element Six Ltd. Such material may have an absorption coefficient measured at room temperature of $\leq 0.2$ cm$^{-1}$, $\leq 0.1$ cm$^{-1}$, or $\leq 0.05$ cm$^{-1}$ at 10.6 µm and/or a dielectric loss coefficient tan δ measured at room temperature at 145 GHz of $\leq 2\times 10^{-4}$, $\leq 10^{-4}$, $\leq 5\times 10^{-5}$, $\leq 10^{-5}$, $\leq 5\times 10^{-6}$, or $\leq 10^{-6}$.

While this invention has been particularly shown and described with reference to preferred embodiments, it will be understood to those skilled in the art that various changes in form and detail may be made without departing from the scope of the invention as defined by the appendant claims.

The invention claimed is:

1. A semiconductor device component comprising:
 a compound semiconductor layer; and
 synthetic diamond heat spreader, wherein the synthetic diamond heat spreader comprises:
 a synthetic diamond material including a surface layer having a $^{13}$C content of less than a natural isotopic abundance (1.1%) and a support layer which is thicker than the surface layer and which has an isotopic abundance of $^{13}$C which is closer to the natural isotopic abundance than the surface layer, wherein at least 50% of a thickness of the synthetic diamond material is formed of the support layer; and
 a non-diamond thermal transfer layer disposed in contact with the surface layer of the synthetic diamond material for transferring heat into the surface layer from the compound semiconductor layer which is disposed on the non-diamond thermal transfer layer,
 wherein the surface layer has a thickness of no more than 20 µm, and
 wherein a distance between the surface layer of the synthetic diamond material and the compound semiconductor layer is no more than 3 µm.

2. A semiconductor device component according to claim 1, wherein the $^{13}$C content of the surface layer is less than 1.0%, 0.8%, 0.6%, 0.4%, 0.2%, 0.1%, 0.05%, or 0.01%.

3. A semiconductor device component according to claim 1, wherein the support layer has a natural isotopic abundance of $^{13}$C.

4. A semiconductor device component according to claim 1, wherein the surface layer has a thickness of no more than 10 µm, 8 µm, 6 µm, 4 µm, 2 µm, or 1 µm.

5. A semiconductor device component according to claim 1, wherein the support layer has a thickness of no less than 10 µm, 30 µm, 50 µm, 70 µm, 90 µm, 110 µm, 130 µm, 150 µm, 180 µm, 200 µm, 250 µm, 350 µm, 500 µm, or 1000 µm.

6. A semiconductor device component according to claim 1, wherein the surface layer has an average thermal conductivity no less than 400 W/mK, 600 W/mK, 800 W/mK, 1000 W/mK, 1200 W/mK, 1400 W/mK, 1600 W/mK, 1800 W/mK, 2000 W/mK, 2200 W/mK, 2400 W/mK, 2600 W/mK, 2800 W/mK, or 3000 W/mK.

7. A semiconductor device component according to claim 1, wherein the support layer has an average thermal conductivity of no less than 400 W/mK, 600 W/mK, 800 W/m K, 1000 W/mK, 1200 W/mK, 1400 W/mK, 1500 W/mK, 1800 W/mK, or 1900 W/mK.

8. A semiconductor device component according to claim 1, wherein at least 90% of the thickness of the synthetic diamond material is formed of the support layer.

9. A semiconductor device component according to claim 1, wherein the synthetic diamond material is CVD synthetic diamond material.

10. A semiconductor device component according to claim 1, wherein the synthetic diamond material is polycrystalline CVD synthetic diamond material.

11. A semiconductor device component according to claim 10, wherein the synthetic diamond material has at least one of: a largest linear dimension of at least 50 mm, 60 mm, 70 mm, 80 mm, 90 mm, 100 mm, 110 mm, 120 mm, 130 mm, or 140 mm; and a thickness of at least 0.2 mm, 0.3 mm, 0.5 mm, 0.75 mm, 1.0 mm, 1.3 mm, 1.5 mm, or 2.0 mm.

12. A semiconductor device component according to claim 1, wherein the synthetic diamond material is single crystal CVD synthetic diamond material.

13. A semiconductor device component according to claim 1, wherein the synthetic diamond material has sufficient mechanical strength that it can form a free-standing wafer.

14. A semiconductor device component according to claim 1, wherein the synthetic diamond material has at least one of:

an absorption coefficient measured at room temperature of $\leq 0.2$ cm$^{-1}$, $\leq 0.1$ cm$^{-1}$, or $\leq 0.05$ cm$^{-1}$ at 10.6 µm; and a dielectric loss coefficient tan δ measured at room temperature at 145 GHz of $\leq 2\times 10^{-4}$, $\leq 10^{-4}$, $\leq 5\times 10^{-5}$, $\leq 10^{-5}$, $\leq 5\times 10^{-6}$, or $\leq 10^{-6}$.

15. A semiconductor device component according to claim 1, wherein a distance between the surface layer of the synthetic diamond material and the compound semiconductor layer is no more than 1 µm, 100 nm, or 50 nm.

16. A semiconductor device component according to claim 1, wherein the compound semiconductor layer is formed of a nitride.

\* \* \* \* \*